US009496390B2

(12) United States Patent
Su et al.

(10) Patent No.: US 9,496,390 B2
(45) Date of Patent: Nov. 15, 2016

(54) VERTICAL TRANSISTOR DEVICE WITH HALO POCKET CONTACTING SOURCE

(71) Applicant: UNITED MICROELECTRONICS CORPORATION, Hsinchu (TW)

(72) Inventors: Hao Su, Singapore (SG); Hang Hu, Singapore (SG); Hong Liao, Singapore (SG)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 311 days.

(21) Appl. No.: 14/024,624

(22) Filed: Sep. 11, 2013

(65) Prior Publication Data

US 2015/0069500 A1    Mar. 12, 2015

(51) Int. Cl.
*H01L 29/78* (2006.01)
*H01L 29/66* (2006.01)
*H01L 21/28* (2006.01)
*H01L 21/265* (2006.01)

(52) U.S. Cl.
CPC ....... *H01L 29/7827* (2013.01); *H01L 21/2815* (2013.01); *H01L 29/66666* (2013.01); *H01L 21/26586* (2013.01)

(58) Field of Classification Search
CPC ............ H01L 29/7827; H01L 29/7802; H01L 29/78642; H01L 29/7833; H01L 29/7834; H01L 29/7385; H01L 29/7836; H01L 29/66666; H01L 29/66674; H01L 29/66681; H01L 29/66689; H01L 21/28141; H01L 21/2815; H01L 21/26586; H01L 21/336; H01L 21/8234; H01L 21/8238; H01L 27/092; H01L 29/78; H01L 29/66; H01L 29/76; H01L 29/94

USPC ............... 257/288, 327, 329, 344, 369, 393; 438/268, 270, 272, 275, 289
See application file for complete search history.

(56) References Cited

U.S. PATENT DOCUMENTS

| | | | | |
|---|---|---|---|---|
| 4,819,043 A | * | 4/1989 | Yazawa | H01L 21/823807 257/344 |
| 5,466,961 A | * | 11/1995 | Kikuchi | H01L 27/115 257/329 |
| 5,675,172 A | * | 10/1997 | Miyamoto | H01L 21/823807 257/392 |
| 5,719,422 A | * | 2/1998 | Burr | H01L 29/1045 257/336 |

(Continued)

OTHER PUBLICATIONS

E. Gili, T Uchino, M. M. A. Hakim, C.H. de Groot, P. Ashburn, S Hall. A new approach to the fabrication of CMOS compatible vertical MOSFETs incorporating a dielectric pocket, At Proceedings of 6th International Conference on Ultimate Integration of Silicon (ULIS) ,2005, p. 127-130., Conference or Workshop Item.

*Primary Examiner* — Marc Armand
*Assistant Examiner* — Younes Boulghassoul
(74) *Attorney, Agent, or Firm* — Ding Yu Tan

(57) ABSTRACT

A vertical transistor device comprises a substrate, a first source, a drain, a first gate dielectric layer, a first gate electrode and a first doping region. The substrate has at least one protruding portion. The first source having a first conductivity type is formed on the substrate. The drain having the first conductivity type is disposed on the protruding portion. The first gate electrode is disposed adjacent to a first sidewall of the protruding portion. The first gate dielectric layer is disposed between the first gate electrode and the first sidewall as well as being disposed adjacent to the first source and the drain. The first doping region having a second conductivity type is formed beneath the protruding portion and adjacent to the first source.

7 Claims, 6 Drawing Sheets

(56) References Cited

U.S. PATENT DOCUMENTS

| | | | | |
|---|---|---|---|---|
| 5,773,863 A * | 6/1998 | Burr | H01L 29/1045 | 257/316 |
| 5,929,477 A * | 7/1999 | McAllister Burns, Jr. | H01L 27/10864 | 257/296 |
| 7,075,148 B2 * | 7/2006 | Hofmann | H01L 21/28282 | 257/316 |
| 7,767,525 B2 * | 8/2010 | Manning | H01L 27/10876 | 257/E21.645 |
| 8,748,270 B1 * | 6/2014 | Shifren | H01L 29/66659 | 257/E21.443 |
| 2002/0185682 A1 * | 12/2002 | Nandakumar | H01L 29/7833 | 257/344 |
| 2004/0178442 A1 * | 9/2004 | Kurabayashi | H01L 21/2815 | 257/327 |
| 2005/0142771 A1 * | 6/2005 | Kim | H01L 29/7827 | 438/289 |
| 2006/0046392 A1 * | 3/2006 | Manning | H01L 29/66787 | 438/268 |
| 2009/0194824 A1 * | 8/2009 | Wirbeleit | H01L 27/11 | 257/393 |
| 2013/0069164 A1 * | 3/2013 | Marino | H01L 21/82343 | 257/369 |
| 2014/0084385 A1 * | 3/2014 | Hoffmann | H01L 29/7833 | 257/402 |

\* cited by examiner

VERTICAL TRANSISTOR DEVICE WITH HALO POCKET CONTACTING SOURCE

FIELD OF THE INVENTION

The present invention relates to a semiconductor package structure and the method for fabricating thereof, and more particularly to a vertical transistor device and the method for fabricating thereof.

BACKGROUND OF THE INVENTION

Typically a vertical transistor device comprises a source, a gate and a drain vertically stacked on a surface of a substrate, wherein the gate is disposed between the source and the drain, so as to form a channel perpendicular to the surface of the substrate. Since the channel length is defined by the thickness of the gate that is deposited on a vertical sidewall of the substrate, thus the lateral size of a transistor element can be significantly decreased and the integrated density of a semiconductor circuit applying the vertical transistor device can be increased.

As each technology nodes shrink, the dimensions of the vertical transistor device and the thickness of its gate, however, must be reduced and short channel effect more likely triggered by the reduced gate thickness.

Therefore, there is a need of providing an improved vertical transistor device and the method for fabricating the same to obviate the drawbacks encountered from the prior art.

SUMMARY OF THE INVENTION

In accordance with one aspect, the present invention provides a vertical transistor device, wherein the vertical transistor device comprises a substrate, a first source, a drain, a first gate dielectric layer, a first gate electrode and a first doping region. The substrate has at least one protruding portion. The first source having a first conductivity type is formed on the substrate. The drain having the first conductivity type is disposed on the protruding portion. The first gate electrode is disposed adjacent to a first sidewall of the protruding portion. The first gate dielectric layer is disposed between the first gate electrode and the first sidewall as well as being disposed adjacent to the first source and the drain. The first doping region having a second conductivity type is formed beneath the protruding portion and adjacent to the first source.

In one embodiment of the present invention, the vertical transistor device further comprises a second source, a second gate dielectric layer and a second gate electrode, wherein the second source having the first conductivity type is formed on the substrate and adjacent to the first doping region; the second gate electrode is disposed adjacent to a second sidewall of the protruding portion; and the second gate dielectric layer is disposed between the second gate electrode and the second sidewall as well as being disposed adjacent to the second source and the drain.

In one embodiment of the present invention, the substrate has the second conductivity type, and the first doping region has a doping concentration substantially greater than that of the substrate and substantially less than that of the first source. In one embodiment of the present invention, the doping concentration of the first doping region is about $1 \times 10^{13}$ cm$^{-3}$.

In one embodiment of the present invention, the first conductivity type is n-type and the second conductivity type is p-type. In one embodiment of the present invention, the first conductivity type is p-type and the second conductivity type is n-type.

In one embodiment of the present invention, the protruding portion has a step height.

In one embodiment of the present invention, the vertical transistor further comprises a second doping region having the second conductivity type, formed in the protruding portion and being disposed adjacent to the drain.

In one embodiment of the present invention, the first doping region is a halo pocket structure.

In accordance with another aspect, the present invention provides a method for fabricating a vertical transistor device, wherein the method comprises steps as follows: A substrate is firstly provided, and then a protruding portion and a first doping region are formed in the substrate, wherein the first doping region is disposed beneath the protruding portion. Next, a first gate dielectric layer and a first gate are sequentially formed to cover a first sidewall of the protruding portion. Thereafter, a drain having a conductivity type different from that of the first doping region is formed on the protruding portion and adjacent to first dielectric layer. Subsequently, a first source having a conductivity type different from that of the first doping region is formed in the substrate and adjacent to the protruding portion and the first gate dielectric layer.

In one embodiment of the present invention, the step for forming the protruding portion and the first doping region comprises: performing an ion implantation process to form the first doping region in the substrate with a first depth measuring from a surface of the substrate; and removing a portion of the substrate to form the protruding portion covering a portion of the first doping region.

In one embodiment of the present invention, prior to the step of removing a portion of the substrate, the method further comprises steps of forming a second doping region having a conductivity type identical to that of the first doping region in the substrate with a second depth measuring from the surface of the substrate, wherein the second depth is substantially less than the first depth.

In one embodiment of the present invention, the step for forming the protruding portion and the first doping region comprises steps of removing a portion of the substrate to form the protruding portion; and performing an ion implantation process to form the first doping region in the substrate and partially underlying the protruding portion. In one embodiment of the present invention, the first doping region is a halo pocket structure.

In one embodiment of the present invention, the step for forming the first gate dielectric layer and the first gate electrode comprises steps of sequentially forming a dielectric layer and a gate material layer on the substrate to cover the protruding portion; and performing a mask-free etching process using the dielectric layer as a stop layer.

In one embodiment of the present invention, the method further comprises steps of forming a second gate dielectric layer and a second gate electrode on a second sidewall of the protruding portion simultaneous to the steps for forming the first gate dielectric layer and the first gate electrode.

In one embodiment of the present invention, the step for removing a portion of the substrate comprises a dry etching process.

In accordance with the aforementioned embodiments of the present invention, a vertical transistor device and a method for fabricating the same are provided; wherein the vertical transistor device comprises a substrate, a source, a drain, a gate dielectric layer and a gate electrode. The substrate has at least one protruding portion and a doping region formed beneath the protruding portion. The source having a conductivity type different from that of the doping region is formed on the substrate and adjacent to the protruding portion and the first doping region. The drain having a conductivity type different from that of the doping region is formed on the protruding portion. The gate dielectric layer covers on a sidewall of the protruding portion and being disposed adjacent to the source and the drain. The gate electrode covers on a side of the gate dielectric layer departing from the protruding portion.

Since the physical arrangement and electrical characteristics of the doping region applied by the vertical transistor device are analogous to a halo pocket structure that is adopted by a planar transistor functioning to diminish short channel effect, thus the doping region of the vertical transistor device that has a conductivity type different from that of the source and is formed beneath the protruding portion can also used to diminish short channel effect triggered by the reduced dimensions of the vertical transistor device as each technology nodes shrink. As a result, the yield of the vertical transistor device can be significantly increased, so as to obviate the drawbacks encountered from the prior art.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
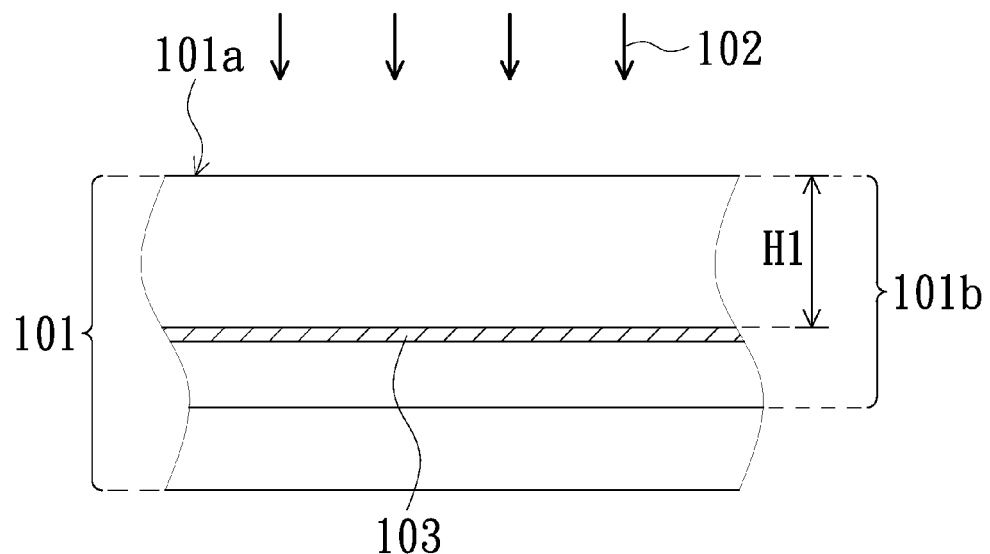
FIGS. 1A-1F are cross-sectional views of the processing structures illustrating a method for fabricating a vertical transistor device in accordance with one embodiment of the present invention.

A vertical transistor device and the method for fabricating the same are provided by the present invention. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A-1F are cross-sectional views of the processing structures illustrating a method for fabricating a vertical transistor device 100 in accordance with one embodiment of the present invention, wherein the method for fabricating the semiconductor device 100 of the one embodiment comprises steps as follows:

Firstly, a substrate 101 having a first surface 101a is provided. In some embodiments of the present invention, the substrate 101 may be a silicon substrate. However, the material of the substrate 101 may not be limited, and in some other embodiments, the substrate 101 may be made of other semiconductor materials.

Next, an ion implantation process 102 is performed to form a doping region 103 in the substrate 101. In some embodiments of the present invention, a plurality of p-type ions, such as boron ion (B+) or the like, are doped into the substrate 101. Alternatively, in some other embodiments of the present invention, a plurality of n-type ions, such as phosphorus (P), arsenic (As), antimony (Sb) ions or the like, are doped into the substrate 101. In the present embodiment, the ion implantation process 102 is performed on a surface 101a of the substrate 101 to implant a plurality of p-type ions into a P-well 101b of the substrate 101 with a depth H1 measuring from the surface 101a of the substrate 101 (see FIG. 1A). Thus, the doping concentration of the doping region 103 is greater than that of the P-well 101b of the substrate 101, wherein the doping concentration of the doping region 103 is about $1\times10^{13}$ $cm^{-3}$.

Figure 1B:
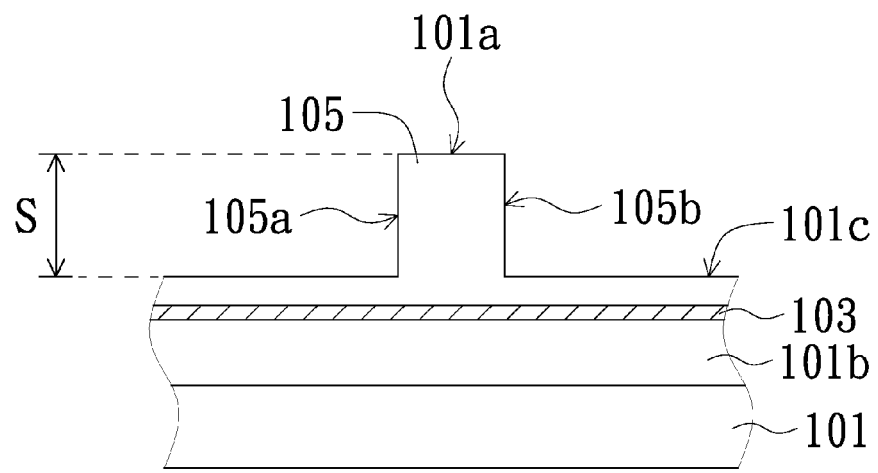
Figure 1C:
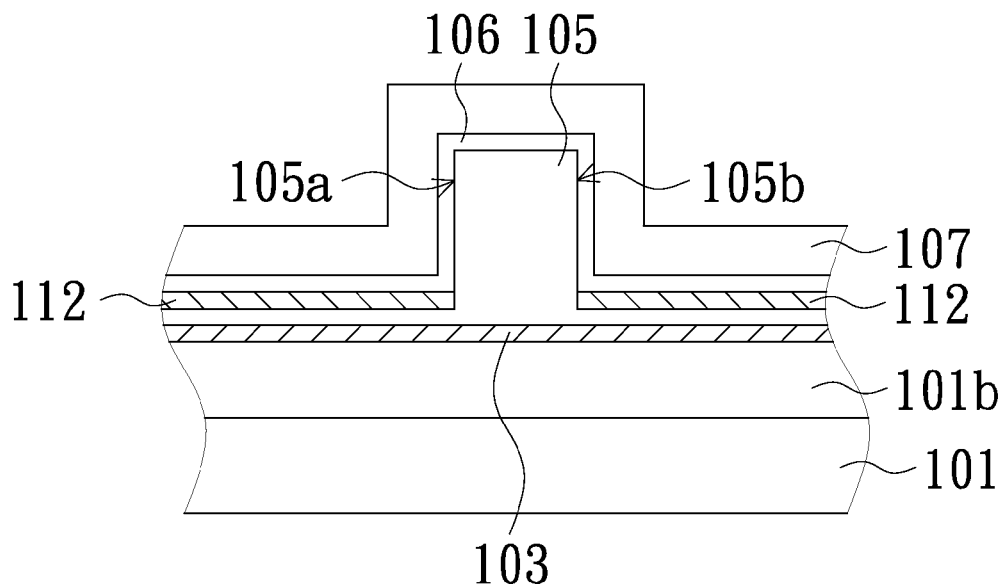

An etching process is then performed to remove a portion of the substrate 101, so as to form a protruding portion 105 covering a portion of the doping region 103 (see FIG. 1B). In the present embodiment, the protruding portion 105 is formed by performing a dry etching process, such as a reactive ion etching (RIE) process (not shown), on the surface 101a of the substrate 101. After a portion of the substrate 101 is removed, at least one protruding portion 105 shaped as a square pillar is remained, wherein the protruding portion 105 has a plurality of sidewalls, such as the sidewalls 105a and 105b, and a remaining portion of the surface 101a of the substrate 101 may serve as a top surface of the protruding portion 105. In other words, the protruding portion 105 has a step height S measuring from the top surface thereof to a surface 101c of the remaining portion of the substrate 101 after the dry etching process is carried out.

Figure 1D:
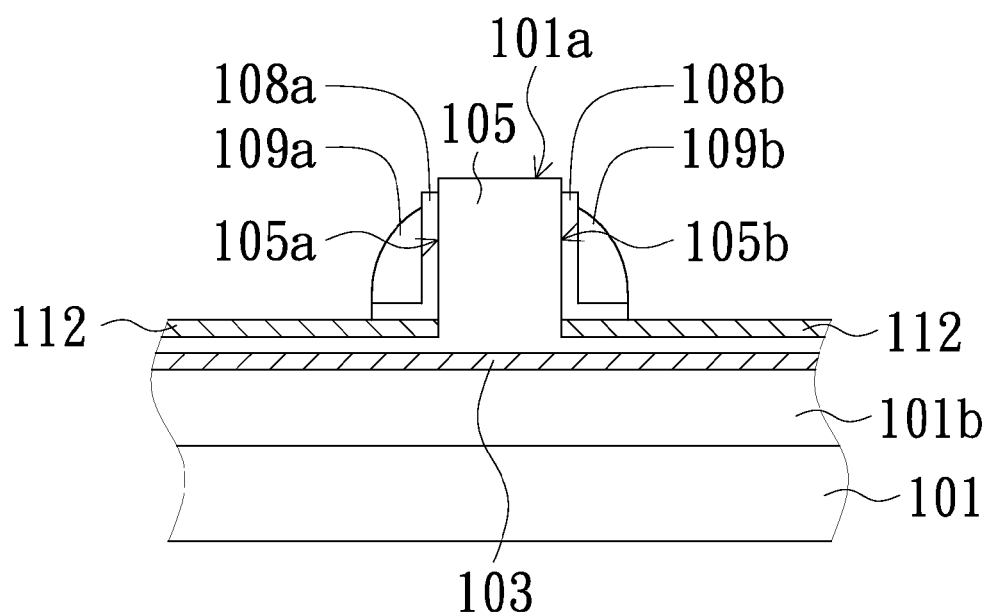

Thereafter, at least one gate dielectric layer (such as the gate dielectric layer 108a or 108b) and at least one gate electrode (such as the gate electrode 109a or 109b) are sequentially formed on at least one sidewall (such as the sidewall 105a or 105b) of the protruding portion 105. In some embodiments of the present invention, the forming of the gate dielectric layers 108a and 108b and the gate electrodes 109a and 109b comprises steps as follows: Firstly, a dielectric layer 106 and a gate material layer 107 are sequentially formed on the substrate 101 in a manner of covering the protruding portion 105 (see FIG. 1C). Then, a mask-free etching process using the dielectric layer 106 as a stop layer is performed to remove a portion of the dielectric layer 106 and a portion of the gate material layer 107. In the present embodiment, merely the portions of the dielectric layer 106 and the gate material layer 107 that are covering on the sidewalls 105a and 105b of the protruding portion 105 are remained. As a result, two symmetrical gate structures (as shown in FIG. 1D) are formed by the mask-free etching process, and the remaining dielectric layer 106 and the remaining gate material layer 107 may serve as the gate dielectric layers 108a and 108b and the gate electrodes 109a and 109b of the two symmetrical gate structures respectively.

Figure 1E:
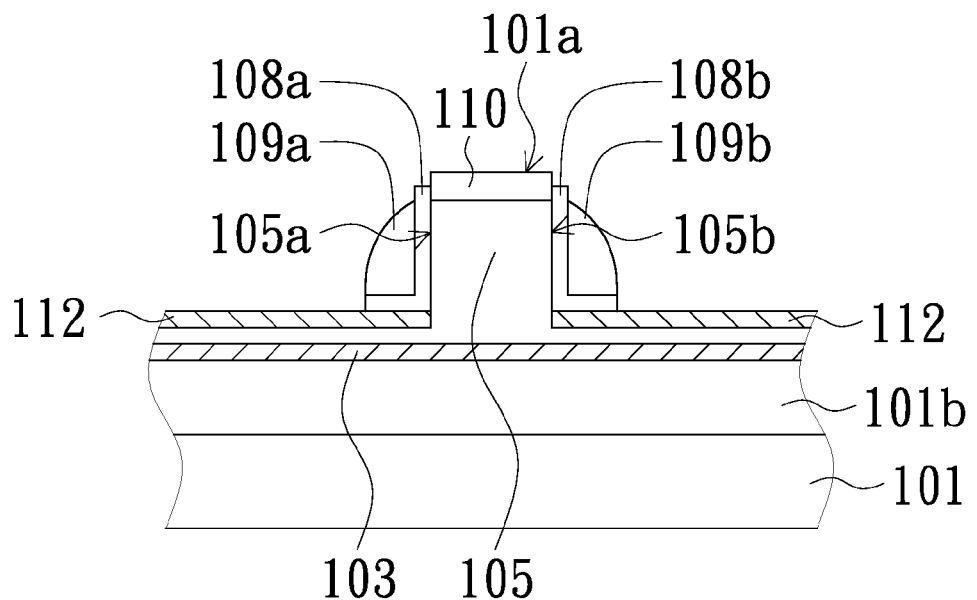

Then, a drain 110 having a conductivity type different from that of the doping region 103 is formed on the protruding portion 105, wherein the drain 110 is disposed adjacent to the gate dielectric layers 108a and 108b as well as being isolated from the gate electrodes 109a and 109b by having the gate dielectric layers 108a and 108b (see FIG. 1E). In some embodiments of the present invention, the drain 110 may be a patterned deposition layer formed on the top surface of the protruding portion 105 (the surface 101a of the substrate 101) by a series of deposition process and doping process. Alternatively, in some other embodiments of the present invention, the drain 110, however, may be a doping region formed in the protruding portion 105 and adjacent to the top surface of the protruding portion 105 (the surface 101a of the substrate 101) by an ion implantation process. In the present embodiment, the drain 110 is an n-type doping region formed in the protruding portion 105 and adjacent to the top surface of the protruding portion 105.

Figure 1F:
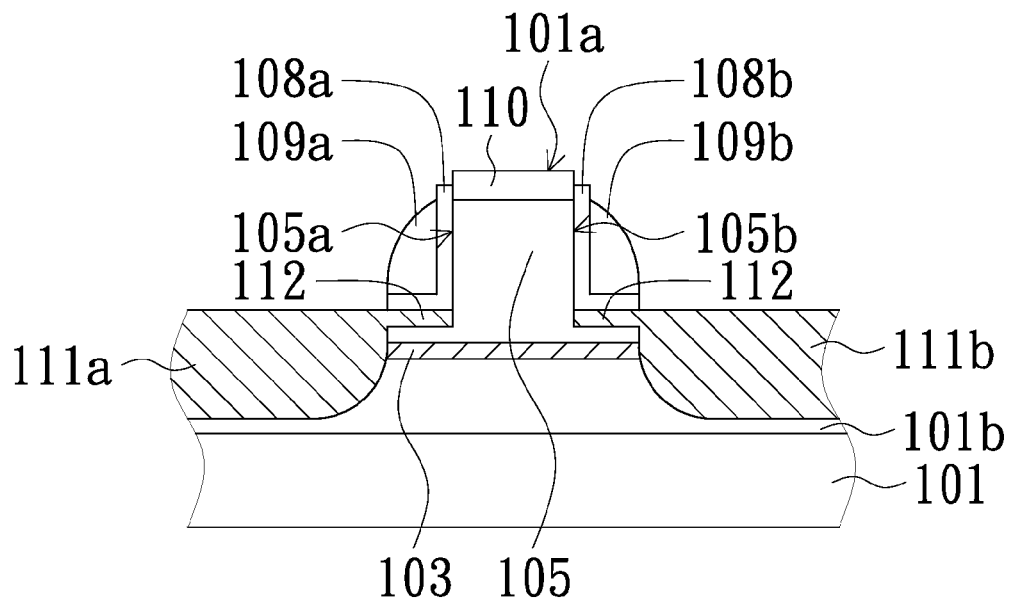

Subsequently, at least one source, such as source 111a and 111b, having a conductivity type different from that of the doping region 103 are formed on the substrate 101 by a series of ion implantation process, wherein the sources 111a and 111b are disposed adjacent to the protruding portion 105 and the gate dielectric layers 108a and 108b as well as being isolated from the gate electrodes 109a and 109b by the gate dielectric layers 108a and 108b. Meanwhile the vertical transistor device 100 as shown in FIG. 1F is completed.

In some embodiments of the present invention, the sources 111a and 111b further comprise a lightly doped region 112. In the present embodiment, the forming of the sources 111a and 111b comprises steps as follows: Prior to the steps for forming the gate dielectric layers 108a and 108b and the gate electrodes 109a and 109b, a lightly doped region 112 is formed in the substrate 101 by implanting a plurality of n-type ions into the substrate 101. After the gate dielectric layers 108a and 108b and the gate electrodes 109a and 109b are formed on the sidewalls of the protruding portion 105, another ion implantation process is performed for directing a plurality of n-type ions into the substrate 101 and covering a portion of the lightly doped region 112, so as to form the sources 111a and 111b. Wherein the doping concentration of the sources 111a and 111b is greater than that of the lightly doped region 112, and the doping concentration of the sources 111a and 111b preferably is also greater than that of the doping region 103.

Because the doping region 103, that has a conductivity type different from that of the sources 111a and 111b, is formed beneath the protruding portion 105 and adjacent to the sources 111a and 111b, the physical arrangement and electrical characteristics of the doping region 103 are analogous to a halo pocket structure that is adopted by a planar transistor functioning to diminish short channel effect. Thus the short channel effect trigged by the reduced dimensions of the vertical transistor device 100 can also be diminished by the doping region 103 as each technology nodes shrink.

Referring to FIG. 1F again, because the vertical transistor device 100 comprises the substrate 101 having the protruding portion 105 vertically protruding therefrom, the (common) drain 110 formed on the protruding portion 105, the two source 111a and 111b symmetrically disposed adjacent to the protruding portion 105, the two gate dielectric layers 108a and 108b symmetrically disposed on the sidewalls of the protruding portion 105 and the two gate electrodes 109a and 109b cover on the gate dielectric layers 108a and 108b, thus there are two symmetrical transistor elements formed on the substrate 101. However this is not always the case, and is not used to limit the scope of the present invention. In some other embodiments, the vertical transistor device may be an asymmetrical structure comprising a single vertical transistor element disposed on one single sidewall of the protruding portion 105.

Figure 2A:
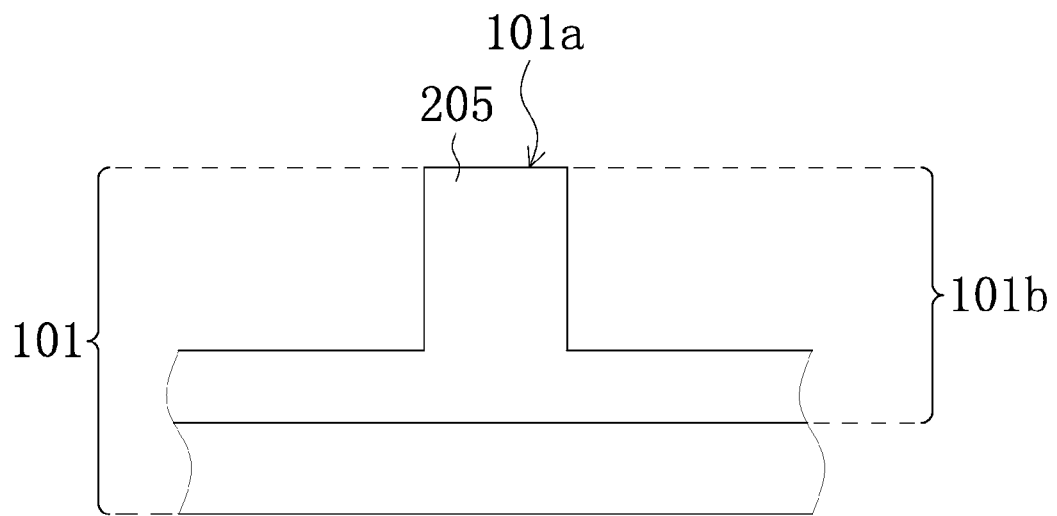
FIGS. 2A-2C are cross-sectional views of processing structures partially illustrating a method for fabricating a vertical transistor device in accordance with an another embodiment of the present invention.
Figure 2B:
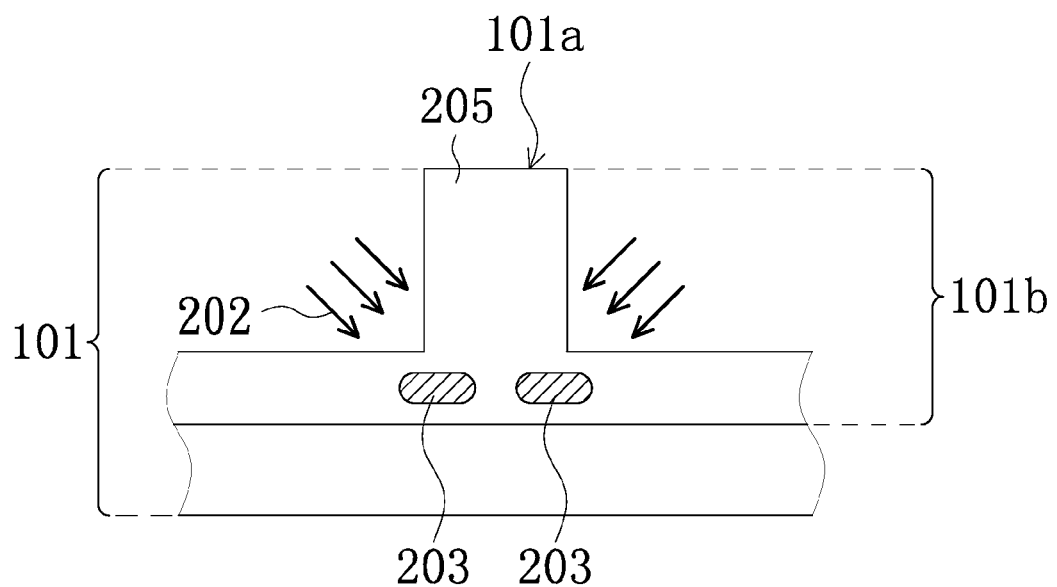
Figure 2C:
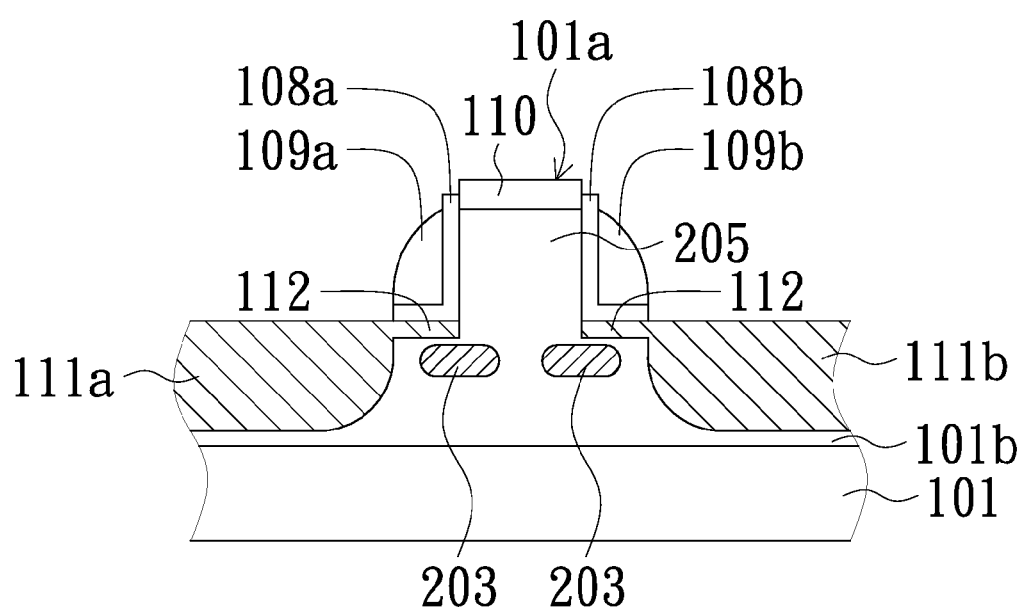

In addition, the protruding portion of the vertical transistor device may be formed as a halo pocket structure. FIGS. 2A-2C are cross-sectional views of the processing structures partially illustrating a method for fabricating a vertical transistor device 200 in accordance with an another embodiment of the present invention, wherein the process for fabricating the vertical transistor device 200 is similar to that for fabricating the vertical transistor device 100 except for the process for forming a doping region 203.

In the present embodiment, the process for forming the doping region 203 comprises steps as follows: Firstly a dry etching process, such as a RIE process (not shown), is performed to remove a portion of the substrate 101, so as to form a square-shape protruding portion 205 (see FIG. 2A). Next, an implantation process 202 with a tilt angle is performed to form a doping region 203 shaped as a ring in the substrate 101 and partially underlying the square-shape protruding portion 205 (see FIG. 2B). Subsequently, the processes depicted in FIGS. 1C-1F are carried out to form the vertical transistor device 200 as shown in FIG. 2C.

Figure 3A:
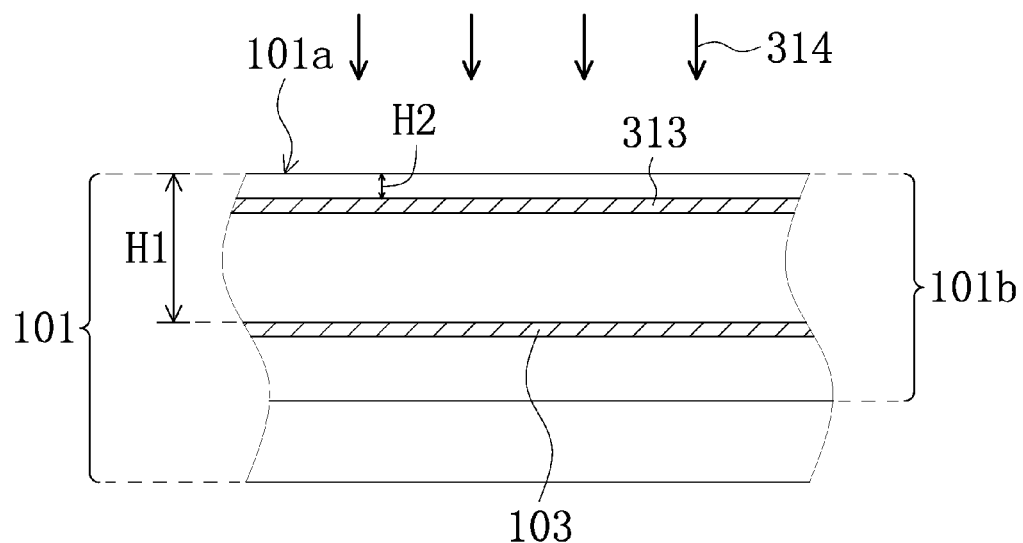
FIGS. 3A-3B are cross-sectional views of processing structures partially illustrating a method for fabricating a vertical transistor device in accordance with a yet another embodiment of the present invention.
Figure 3B:
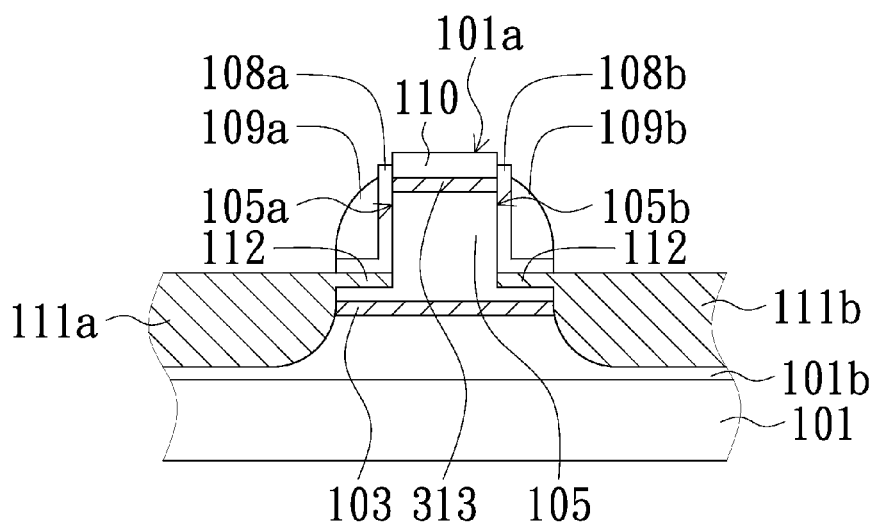

Yet the vertical transistor device may further comprise an another doping region 313. FIGS. 3A-3B are cross-sectional views of the processing structures partially illustrating a method for fabricating a vertical transistor device 300 in accordance with a yet another embodiment of the present invention, wherein the process for fabricating the vertical transistor device 300 is similar to that for fabricating the vertical transistor device 100, except for that an addition step of forming the doping region 313 is included.

In the present embodiment, after the doping region 103 as depicted in FIG. 1A is formed in the substrate 101 and prior to the etching process for forming the protruding portion 105, an additional implantation process 314 is performed to form the doping region 313 in the substrate 101 with a depth H2 measuring from the surface 101a of the substrate 101 (see FIG. 3A), wherein the depth H1 of the doping region 103 is substantially greater than the depth H2 of the doping region 313. In other words, the distance between the doping region 313 and the drain 110 is shorter than the distance between the doping region 103 and the drain 110. Thus, in some embodiments of the present invention, the doping region 313 may be disposed adjacent to the drain 110. Subsequently, the processes depicted in FIGS. 1B-1F are carried out to form the vertical transistor device 300 as shown in FIG. 3C.

In accordance with the aforementioned embodiments of the present invention, a vertical transistor device and a method for fabricating the same are provided; wherein the vertical transistor device comprises a substrate, a source, a drain, a gate dielectric layer and a gate electrode. The substrate has at least one protruding portion and a doping region formed beneath the protruding portion. The source having a conductivity type different from that of the doping region is formed on the substrate and adjacent to the protruding portion and the first doping region. The drain having a conductivity type different from that of the doping region is formed on the protruding portion. The gate dielectric layer covers on a sidewall of the protruding portion and being disposed adjacent to the source and the drain. The gate electrode covers on a side of the gate dielectric layer departing from the protruding portion.

Since the physical arrangement and electrical characteristics of the doping region applied by the vertical transistor device are analogous to a halo pocket structure that is adopted by a planar transistor functioning to diminish short channel effect, thus the doping region of the vertical transistor device that has a conductivity type different from that of the source and is formed beneath the protruding portion can also used to diminish short channel effect triggered by the reduced dimensions of the vertical transistor device as each technology nodes shrink. As a result, the yield of the vertical transistor device can be significantly increased, so as to obviate the drawbacks encountered from the prior art.

While the invention has been described in terms of what is presently considered to be the most practical and preferred embodiments, it is to be understood that the invention needs not be limited to the disclosed embodiment. For example, although the semiconductor devices described in the aforementioned embodiments of the detail description are N-type vertical transistor devices, the features disclosed by the embodiments yet can be applied for P-type vertical transistor devices. In other words, it is intended to cover various modifications and similar arrangements included within the spirit and scope of the appended claims which are to be accorded with the broadest interpretation so as to encompass all such modifications and similar structures.

What is claimed is:

1. A vertical transistor device comprising:
    a substrate, having at least one protruding portion vertically protruding there from;
    a first source, having a first conductivity type and formed on the substrate;
    a drain, having the first conductivity type and disposed on the protruding portion;
    a first gate electrode, disposed adjacent to a first sidewall of the protruding portion;
    a first gate dielectric layer, disposed between the first gate electrode and the first sidewall of the protruding portion as well as disposed adjacent to the first source and the drain; and
    a first doping region, having a second conductivity type and formed beneath the protruding portion and contacting the first source, wherein the protruding portion of the substrate in its entirety is overlapping the first doping region,
    wherein the substrate has the second conductivity type, and the first doping region has a doping concentration greater than that of the substrate and less than that of the first source.

2. The vertical transistor device according to claim 1, further comprising:
    a second source, having the first conductivity type and formed on the substrate and adjacent to the first doping region;
    a second gate electrode, disposed adjacent to a second sidewall of the protruding portion; and
    a second gate dielectric layer, disposed between the second gate electrode and the second sidewall of the protruding portion as well as disposed adjacent to the second source and the drain.

3. The vertical transistor device according to claim 1, wherein first doping region has a doping concentration of $1 \times 10^{13}$ cm$^{-3}$.

4. The vertical transistor device according to claim 1, wherein the first conductivity type is n-type and the second conductivity type is p-type.

5. The vertical transistor device according to claim 1, wherein the first conductivity type is p-type and the second conductivity type is n-type.

6. The vertical transistor device according to claim 1, wherein the protruding portion has a step height.

7. The vertical transistor device according to claim 1, wherein the first doping region is a halo pocket structure.

* * * * *